(12) United States Patent
Racz et al.

(10) Patent No.: US 9,810,721 B2
(45) Date of Patent: Nov. 7, 2017

(54) METHOD OF MAKING A CURRENT SENSOR AND CURRENT SENSOR

(71) Applicant: Melexis Technologies SA, Bevaix OT (CH)

(72) Inventors: Robert Racz, Zug (CH); Bruno Boury, Kontich (BE); Mathieu Ackermann, Lausanne (CH); Laurent Coulot, Lausanne (CH)

(73) Assignee: Melexis Technologies SA, Bevaix (CH)

( * ) Notice: Subject to any disclaimer, the term of this patent is extended or adjusted under 35 U.S.C. 154(b) by 14 days.

(21) Appl. No.: 14/757,866

(22) Filed: Dec. 23, 2015

(65) Prior Publication Data

US 2017/0184636 A1    Jun. 29, 2017

(51) Int. Cl.
    *G01R 15/20* (2006.01)
    *G01R 33/07* (2006.01)
    (Continued)

(52) U.S. Cl.
    CPC ........ *G01R 15/202* (2013.01); *H01L 21/4842* (2013.01); *H01L 23/3107* (2013.01);
    (Continued)

(58) Field of Classification Search
    CPC .... G01R 15/20; G01R 15/202; G01R 15/207; G01R 15/183; G01R 15/185; G01R 33/06; G01R 33/07; G01R 33/09; G01R 33/063; G01R 33/093; G01R 33/096; G01R 33/098
    See application file for complete search history.

(56) References Cited

U.S. PATENT DOCUMENTS

| 5,942,895 A | 8/1999 | Popovic et al. |
| 6,995,315 B2 | 2/2006 | Sharma et al. |

(Continued)

FOREIGN PATENT DOCUMENTS

| EP | 1 746 426 A1 | 1/2007 |
| EP | 2 006 700 A2 | 12/2008 |

(Continued)

OTHER PUBLICATIONS

European Search Report in European Application No. 16205147.8, dated May 18, 2017.

*Primary Examiner* — Minh N Tang
(74) *Attorney, Agent, or Firm* — Nixon Peabody LLP

(57) ABSTRACT

A method of making a current sensor is described. The method includes providing a leadframe having a current conductor portion comprising two sections shaped such that a current to be measured flows in directions oriented obliquely or oppositely with respect to each other. Further, the method includes deforming the leadframe to lower the current conductor portion, and mounting an isolator on the current conductor portion. The method also includes mounting a semiconductor chip having a thickness of at least 0.2 mm and comprising two magnetic field sensors composed of four Hall sensors and magnetic field concentrators on the isolator, connecting the semiconductor chip and sensor terminal leads by wire bonds, packaging the semiconductor chip and parts of the leadframe in a plastic housing, and cutting a frame of the leadframe from current terminal leads and the sensor terminal leads.

20 Claims, 6 Drawing Sheets

Figure 1:
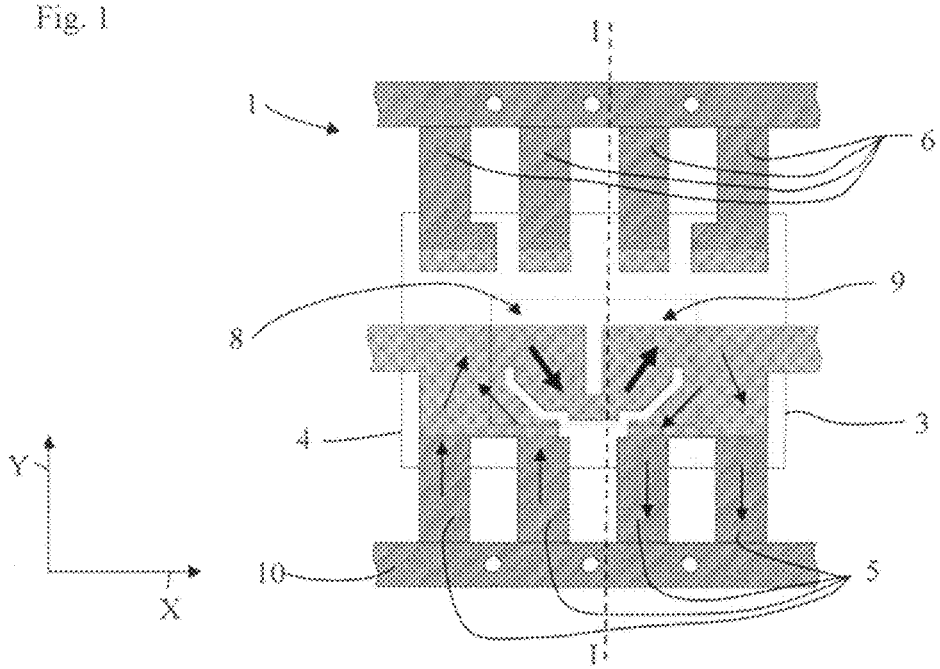

(51) Int. Cl.
  *H01L 21/48* (2006.01)
  *H01L 43/04* (2006.01)
  *H01L 43/14* (2006.01)
  *H01L 23/00* (2006.01)
  *H01L 43/06* (2006.01)
  *H01L 23/31* (2006.01)

(52) U.S. Cl.
  CPC .............. *H01L 24/49* (2013.01); *H01L 24/85* (2013.01); *H01L 43/04* (2013.01); *H01L 43/06* (2013.01); *H01L 43/14* (2013.01); *H01L 2224/48091* (2013.01); *H01L 2224/48247* (2013.01)

(56) References Cited

U.S. PATENT DOCUMENTS

| | | |
|---|---|---|
| 7,075,287 B1 | 7/2006 | Mangtani et al. |
| 7,129,691 B2 | 10/2006 | Shibahara et al. |
| 7,166,807 B2 | 1/2007 | Gagnon et al. |
| 7,259,545 B2 | 8/2007 | Stauth et al. |
| 7,375,507 B2 | 5/2008 | Racz et al. |
| 7,476,816 B2 | 1/2009 | Doogue et al. |
| 7,476,953 B2 | 1/2009 | Taylor et al. |
| 7,518,354 B2 | 4/2009 | Stauth et al. |
| 7,545,136 B2 | 6/2009 | Racz et al. |
| 7,598,601 B2 | 10/2009 | Taylor et al. |
| 7,709,754 B2 | 5/2010 | Doogue et al. |
| 7,746,056 B2 | 6/2010 | Stauth et al. |
| 8,080,994 B2 | 12/2011 | Taylor et al. |
| 8,093,670 B2 | 1/2012 | Taylor |
| 8,760,149 B2* | 6/2014 | Ausserlechner ..... G01R 15/207 324/117 H |
| 8,907,669 B2 | 12/2014 | Petrie |
| 9,176,170 B2 | 11/2015 | Racz |
| 2006/0219436 A1 | 10/2006 | Taylor et al. |
| 2010/0141249 A1 | 6/2010 | Ararao et al. |
| 2010/0156394 A1 | 6/2010 | Ausserlechner et al. |
| 2011/0270553 A1 | 11/2011 | Ausserlechner et al. |
| 2012/0086444 A1 | 4/2012 | Chen et al. |
| 2013/0015839 A1* | 1/2013 | Franke ............... G01R 33/0011 324/117 H |
| 2014/0253103 A1 | 9/2014 | Racz et al. |
| 2014/0333301 A1 | 11/2014 | Racz et al. |

FOREIGN PATENT DOCUMENTS

| | | |
|---|---|---|
| JP | 2003-262650 A | 9/2003 |
| JP | 2003-302428 A | 10/2003 |
| JP | 2003-329749 A | 11/2003 |
| JP | 2013-205387 A | 10/2013 |
| WO | 2004/027436 A1 | 4/2004 |
| WO | 2004/072672 A1 | 8/2004 |
| WO | 2005/026749 A1 | 3/2005 |
| WO | 2006/083479 A1 | 8/2006 |
| WO | 2006/130393 A1 | 12/2006 |
| WO | 2009/148823 A1 | 12/2009 |
| WO | 2011/068653 A1 | 6/2011 |
| WO | 2013/015956 A1 | 1/2013 |
| WO | 2013/015976 A1 | 1/2013 |
| WO | 2013/151792 A1 | 10/2013 |
| WO | 2014/105318 A2 | 7/2014 |

* cited by examiner

METHOD OF MAKING A CURRENT SENSOR AND CURRENT SENSOR

FIELD OF THE INVENTION

The invention relates to a method of making a current sensor packed in an IC housing (IC=integrated circuit), in which the current conductor leads through the housing, and a current sensor produced by this method.

BACKGROUND OF THE INVENTION

Current conductors are available in many configurations and variants. Current sensors, which detect the magnetic field generated by the current, are packed in a conventional IC housing, and in which the current conductor through which the current to be measured flows is guided through the housing, are known for example from U.S. Pat. No. 7,129,691, WO 2005026749, WO 2006130393 and US 2010156394. Such current sensors contain a current conductor which is arranged as a part of a leadframe, which is used for mounting and producing the electrical terminals, and a semiconductor chip mounted on the leadframe, which semiconductor chip comprises at least one magnetic field sensor and the electronics required for its operation and for processing its output signal.

Today's current sensors have to fulfill many requirements, especially high sensitivity, immunity to temperature variations and stress, high dielectric strength of typically 2 to 4 kV between the current conductor and the electronics and finally low production costs.

SUMMARY OF THE INVENTION

The invention is based on the object of developing a current sensor which fulfills the mentioned requirements to a hitherto unrivaled degree.

According to the invention, a current sensor is made with a method comprising the following steps:

providing a leadframe configured with current terminal leads, sensor terminal leads and a current conductor portion integrally coupled to the current terminal leads, the current conductor portion comprising two sections which are shaped in such a way that a current to be measured flows in directions which are oriented obliquely or oppositely with respect to each other, deforming the leadframe to bring the current conductor portion in a position which is lowered with respect to the sensor terminal leads, then mounting an isolator on the current conductor portion, providing a semiconductor chip having a thickness of at least 0.2 mm and comprising four Hall sensors, each Hall sensor integrated at an active surface of the semiconductor chip and providing a Hall output signal, magnetic field concentrators arranged on the active surface of the semiconductor chip, and electronic circuitry integrated at the active surface to operate the Hall sensors and to process the Hall output signals of the Hall sensors in order to provide a current sensor output signal which is proportional to the current flowing through the current conductor portion, wherein two of the Hall sensors and one or more of the magnetic field concentrators form a first magnetic field sensor and wherein the other two of the Hall sensors and one or more of the magnetic field concentrators form a second magnetic field sensor, mounting the semiconductor chip on the isolator such that a back surface of the semiconductor chip which is opposite to the active surface faces the isolator, then connecting the semiconductor chip and the sensor terminal leads by wire bonds, then placing the leadframe in a cavity of a mold, then molding the semiconductor chip and associated parts of the leadframe with plastic material in order to package the semiconductor chip and the named associated parts of the leadframe in a plastic housing, and then cutting a frame of the leadframe from the current terminal leads and the sensor terminal leads.

The method may further comprise applying a stress buffer on top of the magnetic field concentrators and on top of the semiconductor chip, respectively. Preferably, the leadframe has a uniform thickness. The magnetic field concentrators arranged on the active surface of the semiconductor chip may be made by electroplating. The isolator may protrude over the edges of the semiconductor chip and preferably comprises a ceramics or glass plate.

Therefore, a current sensor, made with this method, comprises a plastic housing, current terminal leads and sensor terminal leads protruding out of the housing, a current conductor portion through which a current to be measured may flow, the current conductor portion integrally coupled to the current terminal leads and packaged in the housing, wherein the current conductor portion is formed with two sections which are arranged in such a way that a current to be measured may flow in the two sections in directions which are oriented obliquely or oppositely with respect to each other, and the current conductor is in a position which is lowered with respect to the sensor terminal leads, an isolator is mounted on the current conductor, a semiconductor chip is mounted on the isolator, the semiconductor chip having a thickness of at least 0.2 mm and comprising four Hall sensors, each Hall sensor integrated at an active surface of the semiconductor chip and providing a Hall output signal, magnetic field concentrators arranged on the active surface of the semiconductor chip, and electronic circuitry integrated at the active surface to operate the Hall sensors and to process the Hall output signals of the Hall sensors in order to provide a current sensor output signal which is proportional to the current flowing through the current conductor portion, wherein two of the Hall sensors and one or more of the magnetic field concentrators form a first magnetic field sensor and wherein the other two of the Hall sensors and one or more of the magnetic field concentrators form a second magnetic field sensor, and wire bonds connecting the semiconductor chip and the sensor terminal leads, wherein a back surface of the semiconductor chip which is opposite to the active surface faces the isolator.

The current sensor may further comprise a stress buffer applied on top of the magnetic field concentrators and on top of the semiconductor chip, respectively. Preferably, the current terminal leads, the sensor terminal leads and the current conductor portion have a uniform thickness. The magnetic field concentrators arranged on the active surface of the semiconductor chip are preferably electroplated. The isolator may protrude over the edges of the semiconductor chip and may comprise a ceramics or glass plate.

The current sensor according to the invention is based on the concept of rigorously combining the cheapest and well-established materials and the simplest and well-established semiconductor processing technologies. The conception of the current sensor makes use of:

a standard plastic housing, such as for example a SOIC-8 or SOIC-16 or other equivalent housing, which allows the use of a single and simple leadframe, which does not need any etching processes to locally thin the leadframe, the leadframe providing the current conductor and sensor terminals, Hall sensors comprising one or more Hall effect devices, magnetic field concentrators which amplify and concentrate the magnetic field produced by the current flowing through the current conductor at the place of the Hall sensor, a double-differential sensor measurement arrangement in order to eliminate the influence of external magnetic fields, preservation of a minimum thickness of the semiconductor chip of at least 0.2 millimeter in order to achieve high immunity to stress, simple mechanical deformation of the leadframe for the easily integration of a tape or ceramics plate serving as isolation between the current conductor and the semiconductor chip, and wire bonding technology to connect the semiconductor chip to the sensor terminals of the leadframe.

Preferably, the magnetic field concentrators are made by electroplating which further improves the placement accuracy of the magnetic field concentrators with respect to the Hall sensors.

BRIEF DESCRIPTION OF THE DRAWING FIGURES

Figure 2:
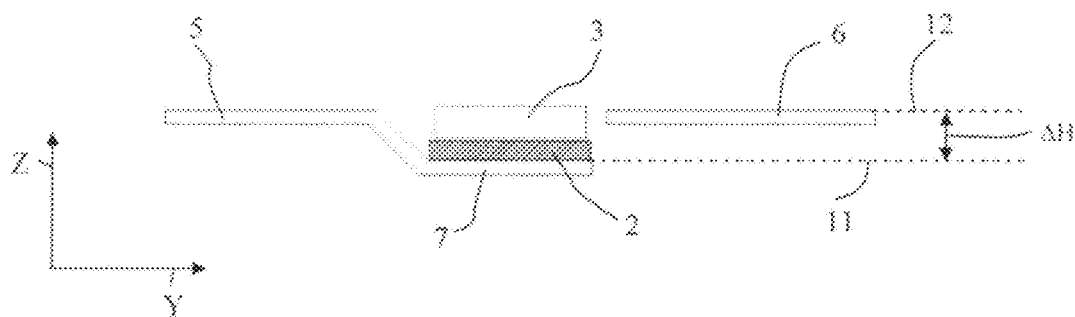
Figure 3:
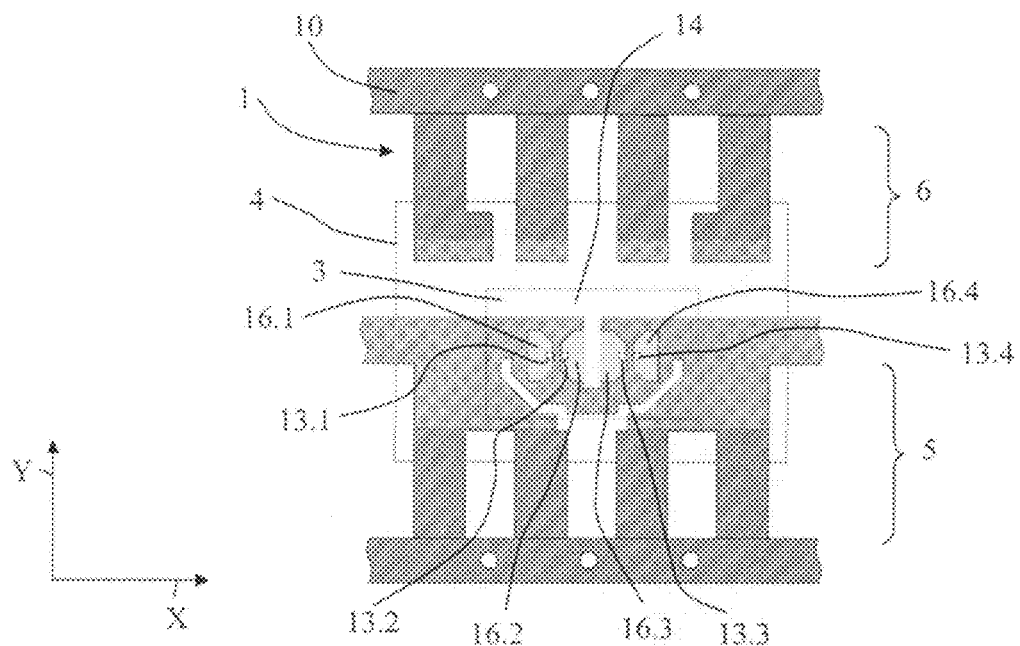
Figure 4:
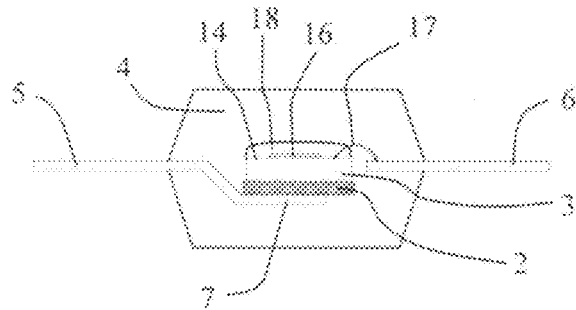
Figure 5:
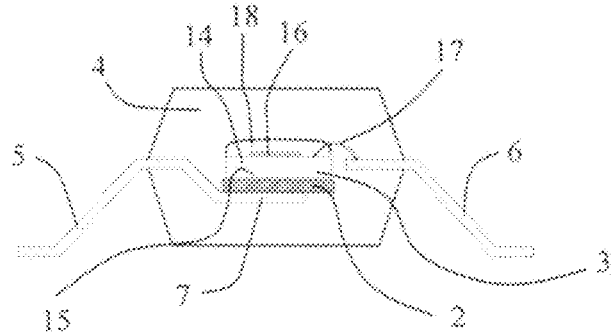
Figure 6:
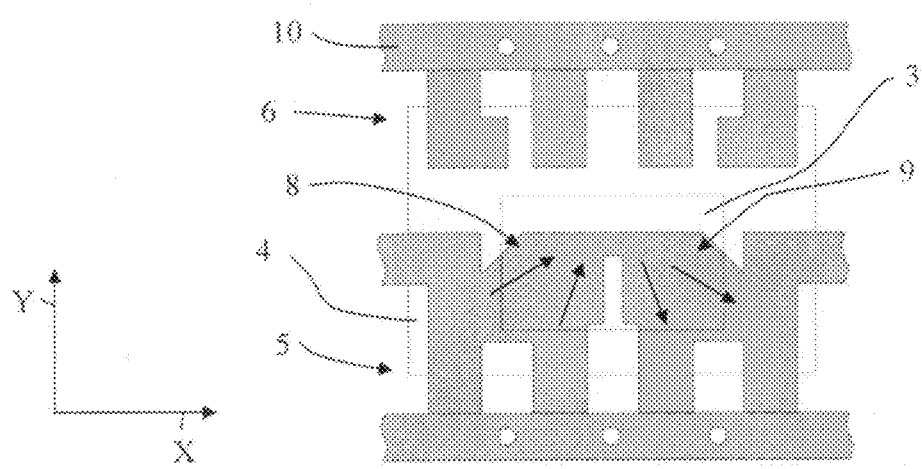
Figure 7:
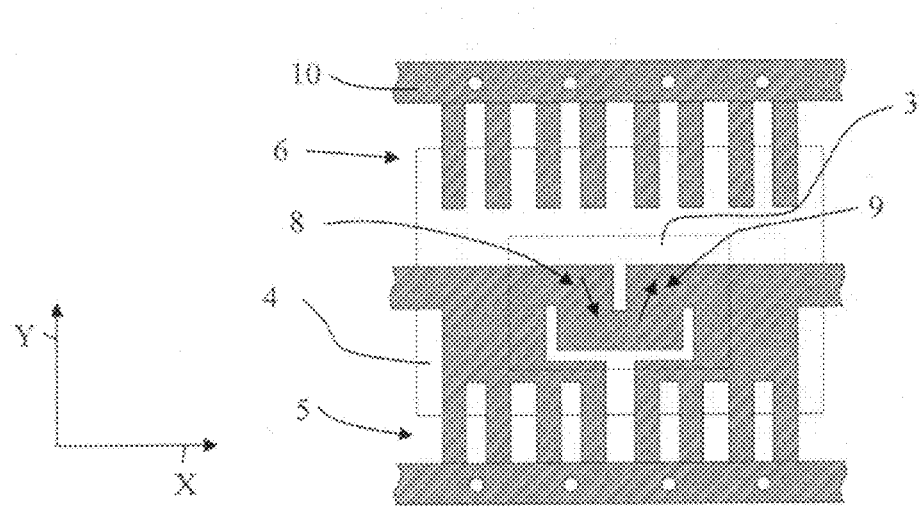
Figure 12:
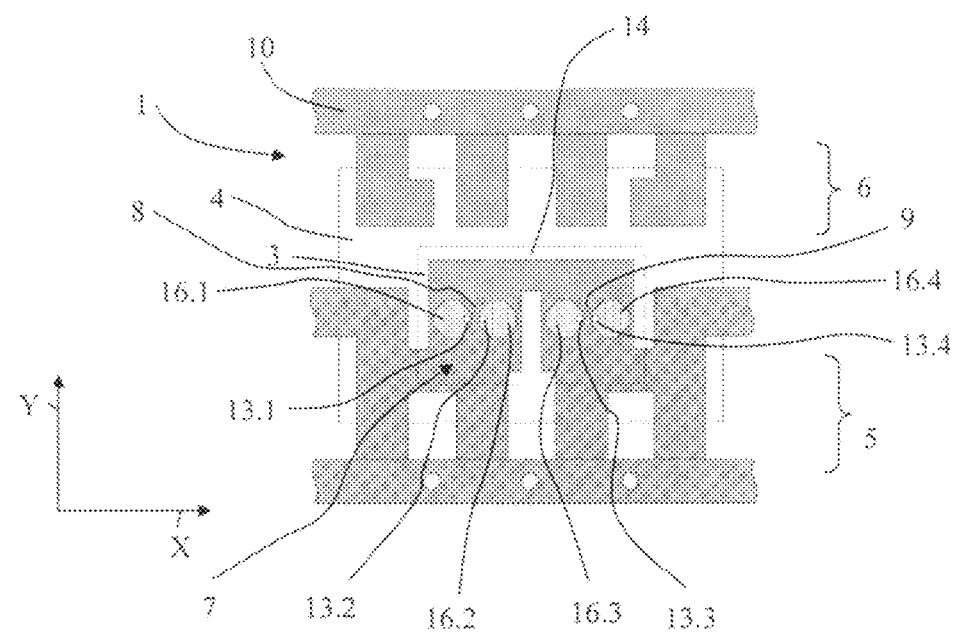
Figure 13:
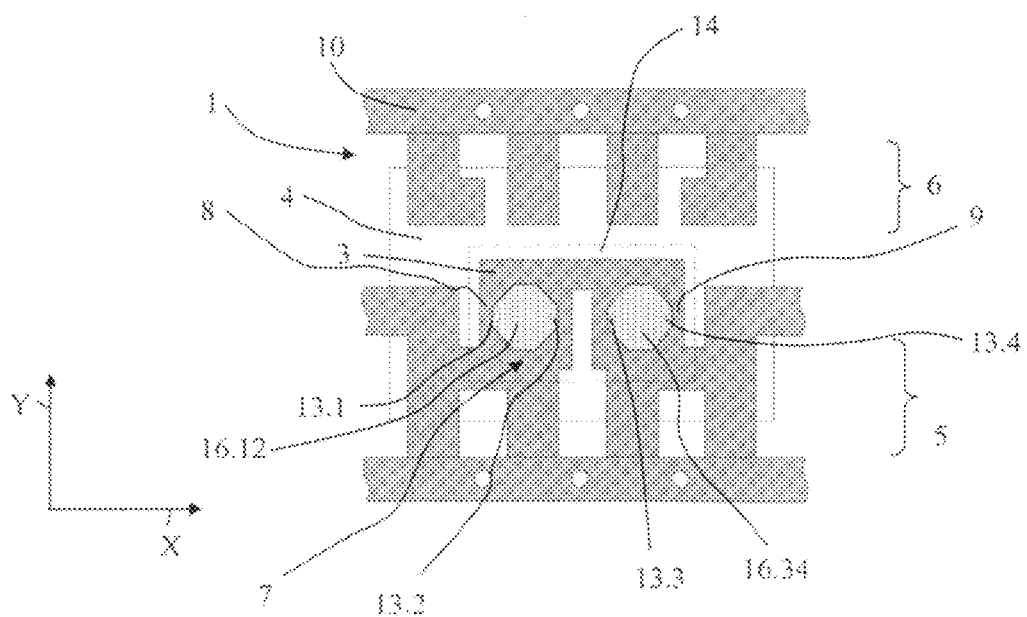

The accompanying drawings, which are incorporated into and constitute a part of this specification, illustrate one or more embodiments of the present invention and, together with the detailed description, serve to explain the principles and implementations of the invention. The figures are not drawn to scale. In the drawings:

FIGS. 1 to 5 illustrate a process of making a current sensor according to the invention, namely FIG. 1 shows a top view of a first embodiment of a leadframe, FIG. 2 shows a cross-section of the leadframe after a deformation step, FIG. 3 shows a top view of the leadframe having a semiconductor chip with magnetic field concentrators, FIG. 4 shows a cross-section of the current sensor after packaging the leadframe and semiconductor chip into a plastic housing, FIG. 5 shows a cross-section of the finished current sensor, FIGS. 6 and 7 show top views of other embodiments of a leadframe, FIGS. 8 to 11 illustrate various numbers and shapes of magnetic field concentrators provided on the semiconductor chip, and FIGS. 12 and 13 illustrate yet other embodiments of a leadframe and magnetic field concentrators.

DETAILED DESCRIPTION OF THE INVENTION

Basically, the current sensor of the present invention is composed of parts cut out of a leadframe 1, an isolator 2, a semiconductor chip 3 and a standard plastic housing 4. The method of making a current sensor according to the invention comprises the following steps 1 to 9 and optional step 10. The method is illustrated by FIGS. 1 to 5 in the following, X, Y and Z denote the axes of a Cartesian coordinate system.

1. Providing a leadframe 1 of uniform thickness, the leadframe 1 configured with current terminal leads 5, sensor terminal leads 6 and a current conductor portion 7 integrally coupled to the current terminal leads 5, wherein the current conductor portion 7 comprises two sections 8 and 9 which are shaped in such a way that the current flows in the two sections 8 and 9 substantially in directions which are oriented obliquely, possibly even oppositely, with respect to each other.

FIG. 1 shows a top view of a first embodiment of such a leadframe 1. The current terminal leads 5 and the sensor terminal leads 6 are—as is usual—connected to a frame 10 of the leadframe 1. The term "directions which are oriented oppositely" is also known as "directions which are antiparallel". FIG. 1 further illustrates the position of the semiconductor chip 3 and the contour of the plastic housing 4 of the finished current sensor.

2. Deforming the leadframe 1 to bring the current conductor portion 7 in a position which is lowered with respect to the current terminal leads 5 and the sensor terminal leads 6.

FIG. 2 shows a cross sectional view of the deformed leadframe 1 along the line I-I of FIG. 1. An isolator 2 which will be mounted later on the current conductor portion 7 of the leadframe 1 and a semiconductor chip 3 which will be mounted later on the isolator 2 are additionally shown for illustration purposes. The current conductor portion 7 lies in a first plane 11, the current conductor leads 5 and the sensor terminal leads 6 lie in a second plane 12. The two planes 11 and 12 are parallel to each other and are separated by a predetermined height difference ΔH. The height difference ΔH may for example be about equal to the combined thickness of the isolator 2 and the semiconductor chip 3.

3. Mounting an isolator 2 on the current conductor portion 7.

4. Providing a semiconductor chip 3, the semiconductor chip 3 having an active surface 14 and a back surface 15 which is opposite to the active surface 14, and a thickness of at least 0.2 mm, the semiconductor chip 3 comprising two magnetic field sensors, each magnetic field sensor comprising two Hall sensors 13 and one or more magnetic field concentrators 16, each Hall sensor 13 integrated in the active surface 14 of the semiconductor chip 3 and providing a Hall output signal and the magnetic field concentrators 16 arranged on the active surface 14 of the semiconductor chip 3, wherein the magnetic field concentrators 16 concentrate the magnetic field produced by the current flowing through section 8 of the current conductor portion 7 on the Hall sensors 13.1 and 13.2 of the first magnetic field sensor and concentrate the magnetic field produced by the current flowing through section 9 of the current conductor portion 7 on the Hall sensors 13.3 and 13.4 of the second magnetic field sensor, and electronic circuitry integrated in the active surface 14 and configured to operate the Hall sensors 13 and to process the Hall output signals of the Hall sensors 13 in order to provide a current sensor output signal which is proportional to the current flowing through the current conductor portion 7.

Reference numeral 13 generally refers to all Hall sensors, while reference numerals 13.1 to 13.4 denote an individual Hall sensor. Reference numeral 16 generally refers to all magnetic field concentrators, while reference numerals 16.1 to 16.4 and 16.23 denote an individual magnetic field concentrator. The term "active surface" means that surface of a semiconductor chip having all the electronic elements like transistors, diodes, resistors, Hall sensors and so on, integrated in the surface while the term "back surface" means the surface lying opposite to the active surface which has no electronic elements. The magnetic field concentrators 16 are electrically isolated from the active surface. The magnetic field concentrators 16 are preferably electroplated magnetic field concentrators.

5. Mounting the semiconductor chip 3 on the isolator 2 such that the back surface 15 of the semiconductor chip 3 faces the isolator 2.
6. Connecting the semiconductor chip 3 and the sensor terminal leads 6 by wire bonds 17.
7. Optionally, applying a stress buffer 18 which covers the magnetic field concentrators 16 and the semiconductor chip 3, respectively.

FIG. 3 shows a top view of the leadframe 1 and the semiconductor chip 3 mounted thereon after step 5. FIG. 4 shows a cross sectional view of the leadframe 1, the isolator 2 and the semiconductor chip 3 after step 6. The position of the housing 4, although not yet present, is also indicated in these figures.

8. Placing the leadframe 1 in a cavity of a mold.
9. Molding the semiconductor chip 3 and associated parts of the leadframe 1 with plastic material in order to package the semiconductor chip 3 and the named associated parts of the leadframe 1 in a plastic housing.
10. Cutting the frame 10 of the leadframe 1 from the current conductor leads 5 and the sensor terminal leads 6. Any parts protruding out of the housing 4 which connect the current conductor to a neighboring current conductor are also cut off
11. Optionally, bending the current conductor leads 5 and the sensor terminal leads 6.

Step 7 can be performed before or after making the wire bonds 17. Steps 8 to 11 are standard and well-established low-cost processes. Plastic housings are available in a great variety. Typical standard plastic housings include SOIC-8 or SOIC-16 and similar housings.

The invention makes use of the simplest and thus cheapest leadframe technology. The leadframe 1 with the current terminal leads 5, the current conductor portion 7 and the sensor terminal leads 6 is punched out from a sheet of metal which has a uniform thickness. No etching steps are applied to make some portions of the leadframe thinner than other portions as would be needed for special housings. Therefore, the leadframe 1 has a uniform thickness.

The deformation of the leadframe 1 is a simple mechanical step that incurs nearly no costs. The deformation of the leadframe 1 serves four combined purposes, namely it enables the use of a semiconductor chip 3 having a relatively large thickness of 0.2 mm or more, it allows the use of a rather thick isolator 2, it allows wire bonding and it allows the use of a standard plastic housing like a SOIC-8 or SOIC-16 or similar housing.

Steps 1 and 2 can even be combined in a single step, wherein the leadframe 1 is simultaneously punched out from a sheet of metal and deformed.

FIGS. 1 and 6 illustrate different layouts of the leadframe 1 for a sensor to be molded into a SOIC-8 housing. In the embodiment shown in FIG. 1 three slits are used to define and mainly border the sections 8 and 9 of the current conductor portion 7. In the embodiment shown in FIG. 6 there are one slit and two cuts used to define and mainly border the sections 8 and 9 of the current conductor portion 7. The current to be measured enters at the two left current terminal leads 5, flows through the current conductor portion 7 and leaves at the two right current terminal leads 5, or vice versa. Arrows illustrate the local direction of the current flowing through the current conductor. For illustration purposes, in FIG. 1 the arrows are drawn thicker in sections 8 and 9. As can be seen, the two sections 8 and 9 are designed such that the current flows in the two sections 8 and 9 substantially in directions which are oriented obliquely, or even oppositely, with respect to each other. FIG. 7 illustrates a layout of the leadframe 1 for a sensor to be molded into a SOIC-16 housing which fulfills the same requirements. Sections 8 and 9 may have a relatively large width which reduces the ohmic resistance. Because the magnetic field concentrators 16 collect "magnetic field lines" produced by the current flowing through the sections 8 and 9 in some space surrounding the sections 8 and 9 they thus compensate for the loss of strength of the magnetic field caused by the relatively large width of the sections 8 and 9.

The isolator 2 provides electrical insulation having a minimum dielectric strength of typically 2 to 4 kV. The isolator 2 may comprise one, two or more layers of insulation to achieve the requirements of single insulation, double insulation or reinforced insulation as defined for example in the UL 60950-1 standard. The isolator 2 may comprise a polyimide film, PTFE (Polytetrafluorethylene), a glass or ceramics plate or any other suitable isolation material and also combinations thereof. A suitable ceramics material is $Al_2O_3$. The isolator 2 may also be a single layer of or comprise a layer of electrically nonconducting adhesive. Polyimide layers or polyimide films or foils are usually sufficient to achieve a dielectric strength of 1 to 3 kV. However, to achieve a higher dielectric strength over lifetime, the use of a plate of ceramics or glass as isolator 2 prevents from partial discharge (i.e. Corona discharge) that may occur in particular in air bubbles of the plastic material of the housing 4. The lateral dimensions of the isolator 2 are preferably larger than the lateral dimensions of the semiconductor chip 3 so that the isolator 2 protrudes over the edges of the semiconductor chip 3, for example by 0.4 mm. The isolator 2 may also comprise a plate of ceramics or glass and a stress buffer separating the ceramics or glass plate and the semiconductor chip 3. The stress buffer may be a layer of polyimide or the like.

The minimum thickness of 0.2 millimeters of the semiconductor chip 3 is of rather high significance as it is a prerequisite to make the current sensor immune or at least rather insensitive to mechanical stress. Furthermore, it has the cost saving advantage that the degree of grinding of the wafer is less than for thinner chips, and furthermore the advantage of an easier mounting process, as the step of picking up the semiconductor chip from the wafer tape is easier than for a thin chip. If there is enough room in the plastic housing 4, the semiconductor chip 3 is preferably thicker than 0.2 mm, i.e. 0.38 or even 0.48 mm which are standard thicknesses of the wafers.

The magnetic field concentrators 16 amplify and concentrate the magnetic fields produced by the current flowing through section 8 and by the current flowing through section 9 at the places of the Hall sensors 13 and thus increase the overall sensitivity of the current sensor. The use of the electroplating technology to make the magnetic field concentrators 16 provides easier manufacturing than the application of ferromagnetic foils and more precise alignment with better control of length, width, thickness and surface roughness of the concentrators 16 with respect to the Hall sensors 13.

Each Hall sensor may be a cluster of Hall elements (also known as Hall effect devices). The Hall elements are sensitive to the component of the magnetic field running perpendicularly to the active surface 14 of the semiconductor chip 3.

The wire bonding technology is a standard and very widely used technology to connect a semiconductor chip with terminal leads. Furthermore, it is a simple and robust technology, but in the field of integrated current sensors it is usually the second choice only (after the flip chip technology) because it comes with the drawback of reducing the sensitivity as the Hall sensors 13 are located on the surface 14 of the semiconductor chip 3 which is more distant from the current conductor portion 7 than its back surface 15. In order to compensate the loss of strength of the magnetic field, the magnetic field concentrators 16 are needed. However, using magnetic field concentrators 16 does not only involve higher costs but entails further that the current conductor portion 7 must be shaped with the two sections 8 and 9 in order to also make use of the differential measuring concept. The differential measuring concept consists in using four Hall sensors 13 which allows the complete elimination of the influence of homogenous disturbing magnetic fields on the current sensor's output signal. The double-differential sensor measurement arrangement of the current invention uses two magnetic field sensors, wherein each magnetic field sensor has two differentially coupled Hall sensors 13 so that each magnetic field sensor is sensitive only to the X-component of the magnetic field and wherein the two magnetic field sensors are coupled differentially to make the current sensor insensitive to external magnetic fields.

In addition to using IC processing technologies incurring the lowest possible costs, the invention combines the shape of the current conductor portion 7 and the function of the magnetic field concentrators 16 in order to achieve an optimal balance between high sensitivity of the current sensor and low ohmic resistance to minimize the production of heat by the current flowing through the current sensor. This is outlined in more detail in the following sections.

Figure 8:
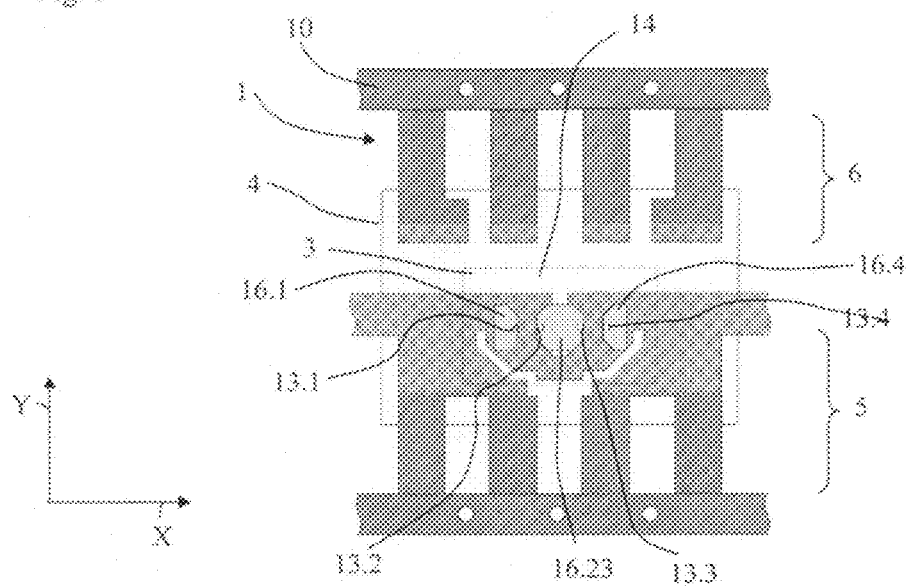
Figure 9:
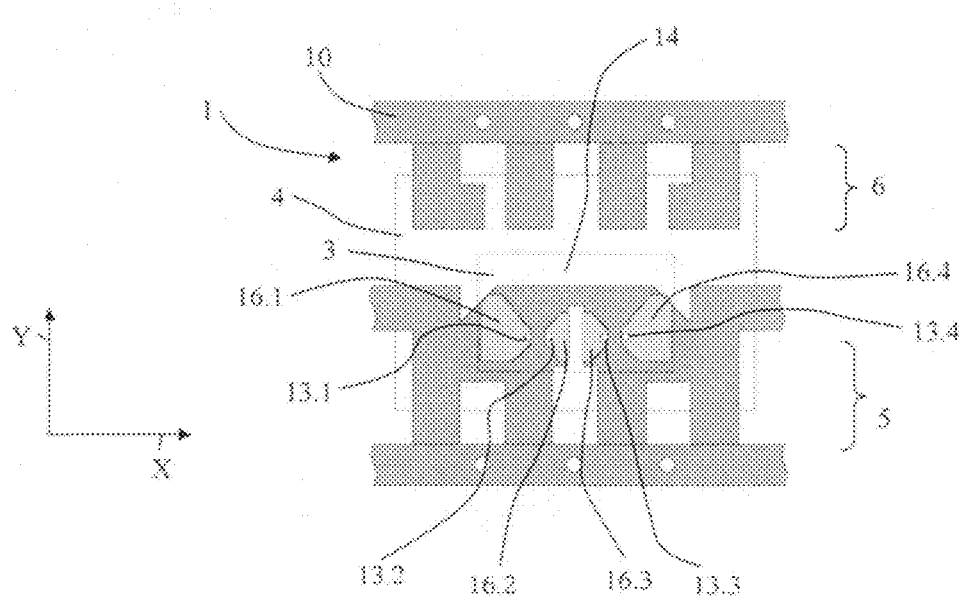
Figure 10:
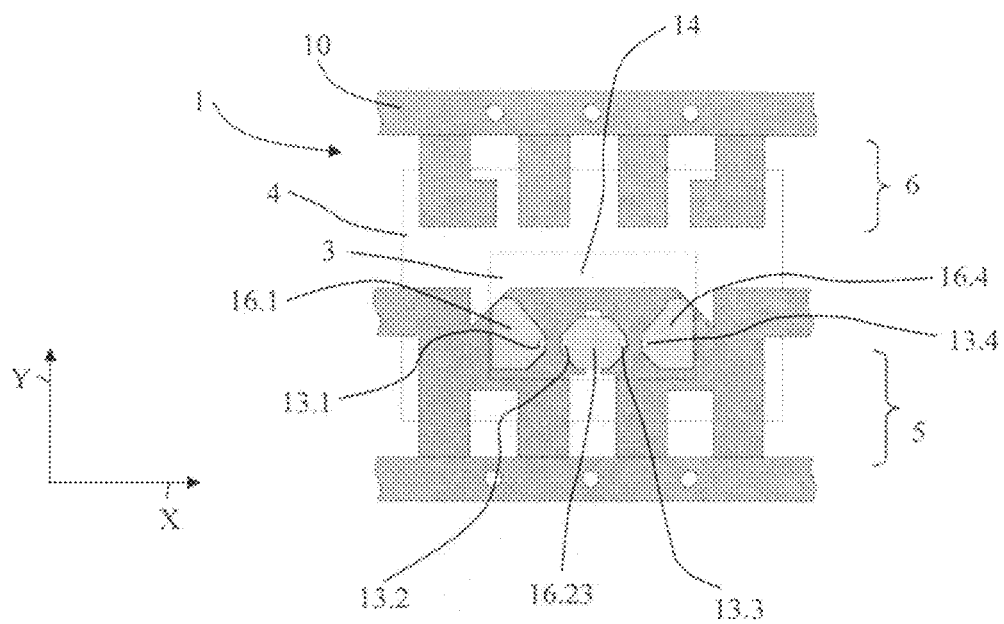
Figure 11:
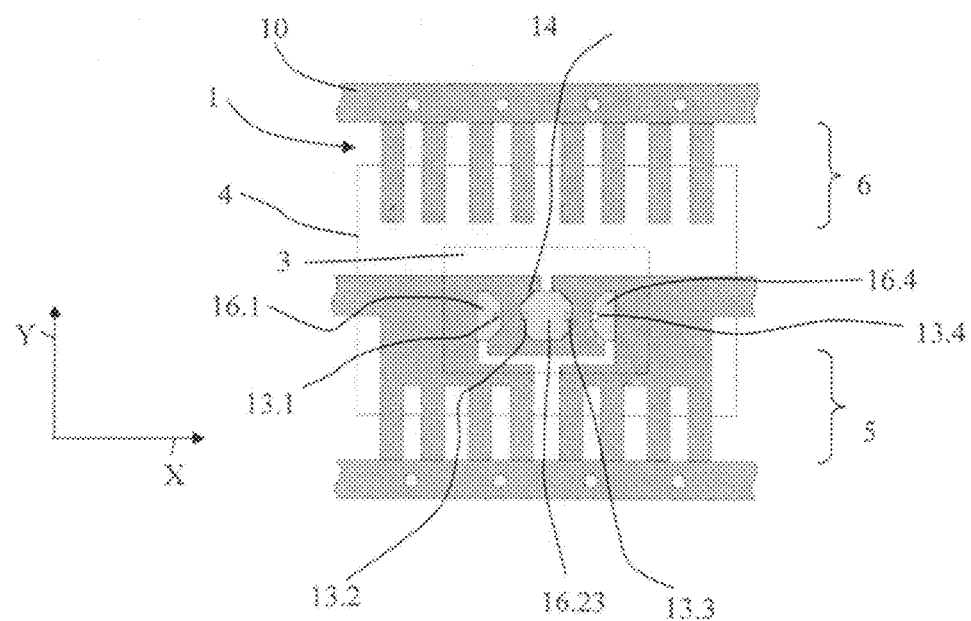

The semiconductor chip 3 contains four Hall sensors 13.1 to 13.4 and four magnetic field concentrators 16.1 to 16.4 or three magnetic field concentrators 16.1, 16.23 and 16.4 or two magnetic field concentrators 16.12 and 16.34. Such embodiments are illustrated in FIGS. 3 and 8 for the leadframe layout shown in FIG. 1, in FIGS. 9 and 10 for the leadframe layout shown in FIG. 6, in FIG. 11 for the leadframe layout shown in FIG. 7, and in FIGS. 12 and 13 for yet another leadframe layout. In the layout of the leadframe shown in FIGS. 12 and 13, the current flows in the two sections 8 and 9 of the current conductor portion 7 substantially in opposite directions.

The magnetic field concentrators 16.1 and 16.2 as well as the magnetic field concentrators 16.3 and 16.4 and also the magnetic field concentrators 16.1 and 16.23 as well as the magnetic field concentrators 16.23 and 16.4 are separated by a distance. In reality, this distance is typically in the order of magnitude of some tens of micrometers, for example about 40 micrometers, but can also be less or more. However, in the drawings this distance is shown much bigger for illustration purposes.

The Hall sensors 13.1 and 13.2 lie on a first connection line, the Hall sensors 13.3 and 13.4 lie on a second connection line. The first and second connection line either coincide or run parallel to each other. The direction of these connection lines is here the X-direction. In an embodiment with four magnetic field concentrators, the magnetic field concentrators 16.1 and 16.2 are placed above section 8 of the current conductor portion 7 in order to concentrate the magnetic field produced by the current flowing through section 8 at the places of two Hall sensors 13.1 and 13.2. The magnetic field concentrators 16.3 and 16.4 are placed above section 9 of the current conductor portion 7 in order to concentrate the magnetic field produced by the current flowing through section 9 at the places of the Hall sensors 13.3 and 13.4. The magnetic field points in opposite directions at the places of the two Hall sensors 13 belonging to the same magnetic field sensor. The magnetic field concentrators 16.1 and 16.2 and the Hall sensors 13.1 and 13.2 form a first magnetic field sensor and the magnetic field concentrators 16.3 and 16.4 and the Hall sensors 13.3 and 13.4 form a second magnetic field sensor. While a Hall sensor 13 alone would measure the component of the magnetic field running perpendicularly to the active surface 14 of the semiconductor chip 3, the combination of two Hall sensors 13 and magnetic field concentrators 16 measures a component of the magnetic field running parallel to the active surface 14 of the semiconductor chip 3 which is here the X-component. This is so because the magnetic field is turned by 90° near the edge of the magnetic field concentrators 16, see for example U.S. Pat. No. 5,942,895, and because the connection line connecting the Hall sensors 13 belonging to the same magnetic field sensor extends in the X-direction.

The middle two magnetic field concentrators 16.2 and 16.3 may be combined to a single magnetic field concentrator 16.23 thus resulting in an embodiment with three magnetic field concentrators. In this embodiment, the magnetic field concentrators 16.1 and 16.23 and the Hall sensors 13.1 and 13.2 form the first magnetic field sensor and the magnetic field concentrators 16.23 and 16.4 and the Hall sensors 13.3 and 13.4 form the second magnetic field sensor.

In all embodiments, the electronic circuitry is configured to operate and process the Hall output signals of the Hall sensors 13.1 and 13.2 in order to create a first common output signal and to operate and process the Hall output signals of the Hall sensors 13.3 and 13.4 in order to create a second common output signal. The first common output signal is sensitive to the magnetic field component pointing in the X-direction and insensitive to the magnetic field components pointing in the Y- and Z-direction. The second common output signal is sensitive to the magnetic field component pointing in the X-direction and insensitive to the magnetic field components pointing in the Y- and Z-direction. Under the assumption that the Hall sensors 13 have identical sensitivity and the magnetic field concentrators 16 are at their ideal places, the two common output signals are of equal strength. But their signs are opposite. The electronic circuitry is further configured to build the difference between the first and second common output signal to deliver a current sensor signal. The current sensor signal is proportional to the current flowing through the current conductor portion 7 and insensitive to disturbing magnetic fields produced by any magnetic field sources that might be present somewhere in the environment of the current sensor, as can be understood from the following explanation.

The current flowing through the first section 8 of the current conductor portion 7 can be described as a first current density distribution which at each point in section 8 can be described as a vector having a certain strength and pointing in a certain direction. The current flowing through the second section 9 of the current conductor portion 7 can be described as a second current density distribution which at each point in section 9 can be described as a vector having a certain strength and pointing in a certain direction. The vectors of the first current density distribution have an X-component pointing in the X-direction and a Y-component pointing in the positive Y-direction whereas the vectors of the second current density distribution have an X-component pointing in the X-direction and a Y-component pointing in the negative Y-direction (or vice versa).

The Y-components of the first current density distribution produce a magnetic field pointing in the X-direction which is collected by the magnetic field concentrators 16.1 and 16.2 or 16.1 and 16.23, respectively, and concentrated at the places of the Hall sensors 13.1 and 13.2. The Y-components of the second current density distribution produce a magnetic field pointing in the negative X-direction which is collected by the magnetic field concentrators 16.3 and 16.4 or 16.23 and 16.4, respectively, and concentrated at the places of the Hall sensors 13.3 and 13.4.

With the presented design of the current conductor portion 7, the magnetic field concentrators 16 and the Hall sensors 13, only the Y-component of the current flowing through the current conductor portion 7 contributes to the current sensor signal. As the Y-component of the current density distributions in the two sections 8 and 9 produces a magnetic field that points in the positive X-direction at the place of the first magnetic field sensor and a magnetic field that points in the negative X-direction at the place of the second magnetic field sensor, while a disturbing magnetic field always points in the same direction, the influence of the (homogeneous part) of any disturbing magnetic field is completely eliminated.

The stress buffer 18, applied optionally on top of the magnetic field concentrators 16 and on top of the semiconductor chip 3, is made of a relatively soft material, for example a layer of polyimide or the like. It assists in reducing mechanical stresses exerted by the plastic housing 4 on the semiconductor chip 3.

The current sensor according to the invention fulfills many requirements, especially high sensitivity, low ohmic resistance of the current conductor, immunity to external magnetic fields, immunity to temperature induced mechanical stress, high dielectric strength of typically 2 to 4 kV between the current conductor and the electronics and this at the lowest possible production costs. Caused by high variations of the temperature of the environment, the leads, especially long leads, are subject to thermal expansion and movement. When using a flip chip arrangement, this would create stress acting on the solder joints between the chip and the leads and might even break the solder joints. The wire bonding technology used protects the current sensor from such crashes.

The invention claimed is:

1. A method of making a current sensor, the method comprising the following steps:
    providing a leadframe configured with current terminal leads, sensor terminal leads and a current conductor portion integrally coupled to the current terminal leads, the current conductor portion comprising two sections which are shaped in such a way that a current to be measured flows in directions which are oriented obliquely or oppositely with respect to each other,
    deforming the leadframe to bring the current conductor portion in a position which is lowered with respect to the sensor terminal leads, then
    mounting an isolator on the current conductor portion,
    providing a semiconductor chip having a thickness of at least 0.2 mm and comprising
        four Hall sensors, each Hall sensor integrated at an active surface of the semiconductor chip and providing a Hall output signal,
        magnetic field concentrators arranged on the active surface of the semiconductor chip, and
        electronic circuitry integrated at the active surface to operate the Hall sensors and to process the Hall output signals of the Hall sensors in order to provide a current sensor output signal which is proportional to the current flowing through the current conductor portion, wherein two of the Hall sensors and one or more of the magnetic field concentrators form a first magnetic field sensor and wherein the other two of the Hall sensors and one or more others of the magnetic field concentrators form a second magnetic field sensor,
    mounting the semiconductor chip on the isolator such that a back surface of the semiconductor chip which is opposite to the active surface faces the isolator, then
    connecting the semiconductor chip and the sensor terminal leads by wire bonds, then
    placing the leadframe in a cavity of a mold, then
    molding the semiconductor chip and associated parts of the leadframe with plastic material in order to package the semiconductor chip and the named associated parts of the leadframe in a plastic housing, and then
    cutting a frame of the leadframe from the current terminal leads and the sensor terminal leads.

2. The method of claim 1, further comprising applying a stress buffer on top of the magnetic field concentrators and on top of the semiconductor chip, respectively.

3. The method of claim 2, wherein the leadframe has a uniform thickness.

4. The method of claim 2, wherein the magnetic field concentrators arranged on the active surface of the semiconductor chip are made by electroplating.

5. The method of claim 4, wherein the isolator protrudes over the edges of the semiconductor chip and comprises a ceramics or glass plate.

6. The method of claim 2, wherein the isolator protrudes over the edges of the semiconductor chip.

7. The method of claim 1, wherein the leadframe has a uniform thickness.

8. The method of claim 1, wherein the magnetic field concentrators arranged on the active surface of the semiconductor chip are made by electroplating.

9. The method of claim 8, wherein the isolator protrudes over the edges of the semiconductor chip and comprises a ceramics or glass plate.

10. The method of claim 1, wherein the isolator protrudes over the edges of the semiconductor chip.

11. A current sensor, comprising
    a plastic housing,
    current terminal leads and sensor terminal leads protruding out of the housing,
    a current conductor portion through which a current to be measured flows, the current conductor portion integrally coupled to the current terminal leads and packaged in the housing, wherein
the current conductor portion is formed with two sections which are arranged in such a way that the current to be measured flows in the two sections in directions which are oriented obliquely or oppositely with respect to each other, and the current conductor portion is in a position which is lowered with respect to the sensor terminal leads, an isolator is mounted on the current conductor portion, a semiconductor chip is mounted on the isolator, the semiconductor chip having a thickness of at least 0.2 mm and comprising four Hall sensors, each Hall sensor integrated at an active surface of the semiconductor chip and providing a Hall output signal, magnetic field concentrators arranged on the active surface of the semiconductor chip, and electronic circuitry integrated at the active surface to operate the Hall sensors and to process the Hall output signals of the Hall sensors in order to provide a current sensor output signal which is proportional to the current flowing through the current conductor portion, wherein two of the Hall sensors and one or more of the magnetic field concentrators form a first magnetic field sensor and wherein the other two of the Hall sensors and one or more others of the magnetic field concentrators form a second magnetic field sensor, and wire bonds connecting the semiconductor chip and the sensor terminal leads, wherein a back surface of the semiconductor chip which is opposite to the active surface faces the isolator.

12. The current sensor of claim 11, further comprising a stress buffer applied on top of the magnetic field concentrators and on top of the semiconductor chip, respectively.

13. The current sensor of claim 12, wherein the current terminal leads, the sensor terminal leads and the current conductor portion have a uniform thickness.

14. The current sensor of claim 12, wherein the magnetic field concentrators arranged on the active surface of the semiconductor chip are electroplated.

15. The current sensor of claim 14, wherein the isolator protrudes over the edges of the semiconductor chip and comprises a ceramics or glass plate.

16. The current sensor of claim 12, wherein the isolator protrudes over the edges of the semiconductor chip.

17. The current sensor of claim 11, wherein the current terminal leads, the sensor terminal leads and the current conductor portion have a uniform thickness.

18. The current sensor of claim 11, wherein the magnetic field concentrators arranged on the active surface of the semiconductor chip are electroplated.

19. The current sensor of claim 18, wherein the isolator protrudes over the edges of the semiconductor chip and comprises a ceramics or glass plate.

20. The current sensor of claim 11, wherein the isolator protrudes over the edges of the semiconductor chip.

\* \* \* \* \*